United States Patent [19]

Hawkins et al.

[11] Patent Number: 5,666,071
[45] Date of Patent: Sep. 9, 1997

[54] DEVICE AND METHOD FOR PROGRAMMING HIGH IMPEDANCE STATES UPON SELECT INPUT/OUTPUT PADS

[75] Inventors: Keith G. Hawkins, Dripping Springs; Harikumar B. Nair; Shivachandra I. Javalagi, both of Austin, all of Tex.

[73] Assignee: Advanced Micro Devices, Inc., Sunnyvale, Calif.

[21] Appl. No.: 565,684

[22] Filed: Dec. 1, 1995

[51] Int. Cl.$^6$ .................... H03K 19/0175; H03K 19/094
[52] U.S. Cl. ........................ 326/86; 326/45; 326/50; 326/56
[58] Field of Search ................. 326/86, 83, 38, 326/45, 50, 56, 58

[56] References Cited

U.S. PATENT DOCUMENTS

| | | | |
|---|---|---|---|
| 4,071,904 | 1/1978 | Miller . | |
| 4,779,229 | 10/1988 | Agrawal | 326/38 |
| 4,940,909 | 7/1990 | Mulder et al. | 326/38 |
| 5,087,840 | 2/1992 | Davies et al. | 326/58 |
| 5,115,191 | 5/1992 | Yoshimori . | |
| 5,151,621 | 9/1992 | Goto | 326/86 |
| 5,391,940 | 2/1995 | Linn | 326/86 |
| 5,402,014 | 3/1995 | Ziklik et al. | 326/38 |
| 5,410,267 | 4/1995 | Haycock et al. | 326/81 |

FOREIGN PATENT DOCUMENTS

| | | |
|---|---|---|
| 0 364 925 A1 | 4/1990 | European Pat. Off. . |
| 0 522 413 A2 | 1/1993 | European Pat. Off. . |

OTHER PUBLICATIONS

IBM Technical Disclosure Bulletin entitled "Loading Test Patterns Into Complex Semiconductor Chips Using Isolated Outboard Level Sensitive Scan Design Chains", vol. 29, No. 3, Aug. 1986, New York, U.S.A., XP002016050, p. 1202–1203.

*Primary Examiner*—David R. Hudspeth
*Assistant Examiner*—Richard Roseen
*Attorney, Agent, or Firm*—Kevin L. Daffer; Conley, Rose & Tayon

[57] ABSTRACT

An integrated circuit incorporating programmable pullup and pulldown devices into each input/output (I/O) pad is described. Each I/O pad may be individually programmed to include a pullup or pulldown function. Pullup and pulldown resistors may be removed from a system employing the present integrated circuit. Programming of the I/O pads may be accomplished in a number of ways. Following the deassertion of a reset signal, high impedance states may be transferred into a shift data storage within the integrated circuit. Once the states are received, they are shifted to the respective I/O pads through a serial chain connection of the pullup and pulldown devices within each I/O pad. The states are then maintained by each pullup and pulldown device until a subsequent reprogramming. Software programs may also reprogram the pullup and pulldown states by storing appropriate values into the shift data storage. The program then sets an appropriate value into a status register included within the integrated circuit. Upon detection of the value within the status register, the integrated circuit reprograms the high impedance states of the I/O pads with the states stored in the shift data storage.

32 Claims, 6 Drawing Sheets

DEVICE AND METHOD FOR PROGRAMMING HIGH IMPEDANCE STATES UPON SELECT INPUT/OUTPUT PADS

BACKGROUND OF THE INVENTION

1. Field of the Invention

This invention relates to the field of integrated circuits and, more particularly, to high impedance states programmably formed on select input/output pads of an integrated circuit.

2. Description of the Relevant Art

Complimentary metal-oxide-semiconductor (CMOS) has become popular when used in low power integrated circuit devices. A CMOS device includes both p-channel (PMOS) and n-channel (NMOS) transistors, wherein current is designed to flow from the source terminal to the drain terminal of the transistor when the voltage upon a gate conductor exceeds a threshold amount. Current flows in a PMOS transistor when gate voltage is lower than the voltage upon the source terminal. Current flows in an NMOS transistor when gate voltage is higher than the voltage upon the source terminal.

In order to retain the low power advantages of a CMOS device, it is important to ensure the gate terminal voltage not be allowed to float during periods of non-use. If the gate terminal voltage is left to float between, e.g., a power supply and ground, then that device as well as possibly other connected devices may turn on thereby causing momentary shorting of the power supply. This problem becomes readily apparent at the electrical interface lines between integrated circuits employing CMOS devices.

CMOS integrated circuits, and integrated circuits fabricated in other semiconductor technologies, interface to one another using buses. Signals upon the buses are activated and deactivated according to a predetermined protocol. Circuits employing the protocol are embodied on each integrated circuit, wherein the circuits are bus interconnected. Signals upon the bus may be classified with respect to a particular integrated circuit as input and/or output signals. Input signals are received by an integrated circuit; output signals are conveyed by the integrated circuit; and input and output (input/output signals or bi-directional signals) may be an input signal during one clock cycle and an output signal during another clock cycle. The protocol employed by the integrated circuit determines whether an input/output signal is an input or an output signal during a clock cycle. It is noted that a signal is activated when it conveys a value indicative of a certain item of information, and deactivated when it conveys a value which is not indicative of the certain item of information. A signal may be activated when it conveys a logical zero value or, conversely, when it conveys a logical one value. It is further noted that the term "clock cycle", as used herein, refers to the period of a clock signal coupled to the integrated circuit. The clock signal defines times at which memory elements (such as registers) capture a value from their inputs. The value is stored by the memory element during the next clock cycle. Combinatorial logic coupled between memory elements calculates the new value to be captured by each memory element during the clock cycle.

Input/output signals often may be idle during certain clock cycles (i.e. no integrated circuit is conveying a value upon the bus during that clock cycle). During such clock cycles, the conductors upon which the input/output signals are conveyed may be floating; namely, the conductors are not being driven to a defined logic one or zero voltage level. The gate terminal of a CMOS transistor which receives a conductor having a floating value signal will draw unacceptably large amounts of power. CMOS devices draw the least amount of power when their inputs are at the upper supply level (i.e., VDD or VCC power level) or at ground voltage level. If the gate terminals of those devices are allowed to float between power and ground, then significantly larger amounts of power will be consumed. Often, system designers install pullup or pulldown resistors at the input/output pads of an integrated circuit to prevent input/output pads from floating. Instead, a power supply or ground voltage level is applied to the pads during times in which the conductors are presently not in use. Unfortunately, these resistors increase overall system cost.

It would be desirable for an integrated circuit to be programmably configurable. More specifically, there would be advantages to design an integrated circuit having a feature for programmably connecting a path between a non-used input/output pad and power (or ground) voltages. The programmable feature would include a mechanism for selectively activating a pullup or pulldown resistor connectable to the input/output pad of an interface conductor. The interface conductor extends from the input/output pad of one integrated circuit to an input/output pad of another integrated circuit. As such, a programmably active pullup device on one integrated circuit ensures the gate terminal of a PMOS device of another integrated circuit, connected to the active pullup via an interface bus conductor, is turned completely off and does not consume power when not in use. Further, a programmably active pulldown resistor on one integrated circuit ensures the connected gate terminal of a non-used NMOS device of another integrated circuit is turned completely off. The programmable device must be one capable of reconfiguring pullup and pulldown features of select input/output pads depending upon the state of those pads. For example, if an active signal is forwarded across a pad during one clock cycle and an inactive signal is sent in a subsequent cycle, the associated pad must not be configured with a pullup or pulldown in the initial cycle but must be configured (either with a pullup or with a pulldown) during the next cycle. Selection of how and when to configure a pad presents numerous problems which must be overcome before programmability of pullup and pulldown can be achieved.

SUMMARY OF THE INVENTION

The problems outlined above are in large part solved by an integrated circuit according to the present invention. The present integrated circuit includes input/output pads arranged near the periphery of the circuit. Incorporated into each input/output (I/O) pad area is a programmable pullup and pulldown device. Each I/O pad may be individually programmed to include either a pullup or pulldown function during clock cycles in which the associated I/O conductor is inactive or idle. Advantageously, pullup and pulldown resistors may be removed from a system employing the present integrated circuit. Cost savings are thereby realized in fabricating a system utilizing the present integrated circuit as opposed to integrated circuits not equipped with programmable pullup and pulldown functionality. Additionally, minimal power consumption is achieved by defining a power or ground voltage level on input/output pads associated with conductors of idle buses.

The present integrated circuit enables power management functions to be employed via a flexible programming structure. A bus may require a pullup function during normal operation, but may require a pulldown function during a low power mode—i.e., power management mode. The pullup and pulldown devices of the I/O pads forming the bus may be reprogrammed at any time to any suitable high impedance state (such as a pullup or pulldown state). A high impedance state is important when the bus signal is inactive and the bus is said to be in a tri-stated or floating condition. The high impedance state thereby defines the voltage level of the bus signal during the tri-state condition.

In one embodiment, programming of the I/O pads is accomplished as follows: Binary control signals indicative of high impedance states are transferred into a shift data storage unit within the integrated circuit. Once the states are received, they are shifted to the respective I/O pads through a serial chain connection of the pullup and pulldown devices within each I/O pad. The states are then maintained by each pullup and pulldown device until a subsequent reprogramming.

Broadly speaking, the present invention contemplates an integrated circuit having a high impedance programming unit, a shift data storage, and a plurality of input/output pads. The high impedance programming unit is configured to program the plurality of input/output pads with respective high impedance states. Coupled to the high impedance programming unit, the shift data storage is configured to store a plurality of high impedance states. The plurality of input/output pads are coupled to the shift data storage and are configured to maintain the high impedance states.

The present invention further contemplates a method of programming a plurality of pullup and pulldown devices associated with a plurality of input/output pads comprising at least three steps. First, data indicative of a high impedance state for each of the plurality of input/output pads is received and stored. Second, the received data is shifted to the input/output pads. Each one of the plurality of input/output pads receives a respective one of the high impedance states. Third, the respective high impedance states are latched into the plurality of pullup and pulldown devices such that the pullup and pulldown devices are enabled according to the respective ones of the high impedance states.

BRIEF DESCRIPTION OF THE DRAWINGS

Other objects and advantages of the invention will become apparent upon reading the following detailed description and upon reference to the accompanying drawings in which.

Figure 1:
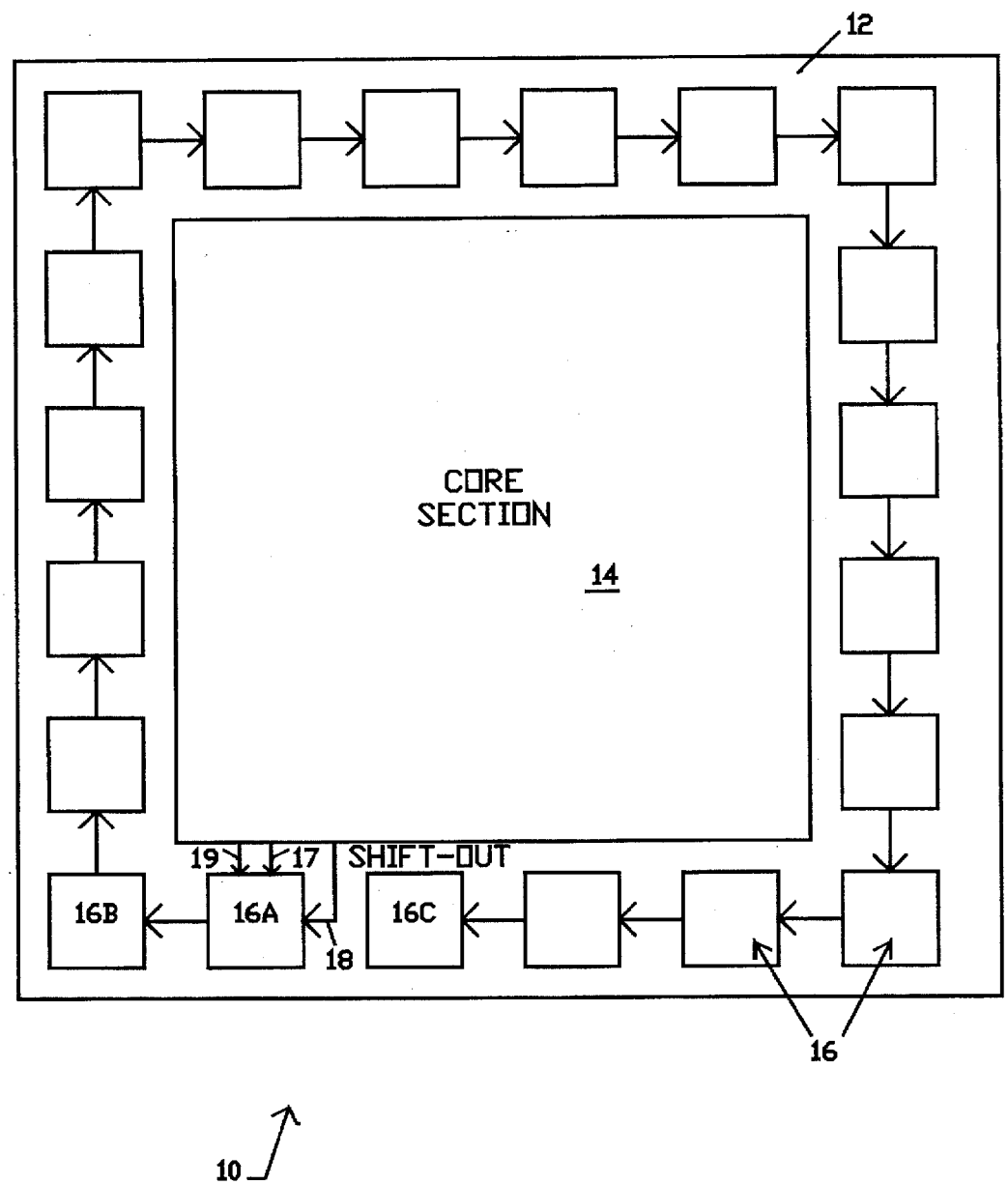
FIG. 1 is a block diagram of an integrated circuit including a core section and a plurality of input/output pads.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a block diagram of an integrated circuit 10 is shown. Integrated circuit 10 is divided into a core section 14 and an input/output (I/O) section 12. Core section 14 contains circuits which implement the various functions which integrated circuit 10 carries out. I/O section 12 contains circuits which effectuate communication between core section 14 and other integrated circuits and/or electrical devices coupled on a substrate separate from integrated circuit 10. As shown in FIG. 1, I/O section 12 includes a plurality of input/output pads 16. I/O pads 16 include conductive elements for connection between pins upon the integrated circuit package and circuit conductors within core 14. The pins are electrically connected to pins on other electronic devices via, for example, printed conductors of a printed circuit board. Circuits associated with I/O pads 16 may include input receiver circuits, output driver circuits, and input/output driver circuits.

Input receiver circuits are configured to receive communicative signals from integrated circuits and electrical devices arranged external to integrated circuit 10. Input receiver circuits serve as a buffer to protect devices within core section 14 from relatively large voltage levels that may occur at inputs to integrated circuit 10. Also, signals received by receiver circuits tend to have slow rise and fall times associated with them. The term "rise time" refers to an interval of time during which a signal transitions from a low voltage level to a high voltage level. The term "fall time" refers to an interval of time during which a signal transitions from a high voltage level to a low voltage level. Digital circuits operate more efficiently when they receive signal inputs having fast rise and fall times, and so the input receiver circuits convert the slow rise and fall time input signals to a fast rise and fall time signal suitable for circuits within core section 14.

Output driver circuits are configured to "drive" (i.e. transfer) communicative signals from core section 14 to externally connected integrated circuits and electrical devices. Output driver circuits provide a relatively large amount of current necessary to charge capacitances associated with external connections between electrical devices. Therefore, transistors within core section 14 need not be capable of relatively high current levels and may instead be configured to drive the relatively smaller capacitances associated with internal connections of integrated circuit 10. Output driver circuits serve to buffer circuits within core section 14 from the larger external voltages attributable to I/O operation.

Input/output driver circuits within I/O section 12 are configured to both drive and receive (i.e. interface) communicative signals to and from core section 14. Circuits within core section 14 and within externally connected integrated circuits and electrical devices utilize a predetermined protocol for determining when a device may drive communicative signals which operate as both input and output signals. The predetermined protocol guarantees that no two integrated circuits or electrical devices drive a particular input/output signal simultaneously.

In one embodiment, each I/O pad 16 (except power supply and ground pads) includes programmable pullup and pulldown devices. A pullup device is configured to provide a pullup function, and a pulldown device is configured to provide a pulldown function. Pullup and pulldown devices are programmed with a particular high impedance state according to the needs of the system into which integrated circuit 10 is configured. A "high impedance state" refers to a state that integrated circuit 10 applies to a conductor during clock cycles in which the conductor would otherwise be floating. In one embodiment, the high impedance state of a particular I/O pad 16 may be a pullup state, a pulldown state, or a state specifying no pullup/pulldown function. The pullup state defines a pullup function for the particular I/O pad 16. Alternatively, the pulldown state defines a pulldown function for the particular I/O pad 16. Yet another alternative is the state specifying no pullup/pulldown state (i.e. a floating state).

I/O pads 16 are serially coupled to one another to allow programming of the respective high impedance state into each I/O pad's pullup and pulldown devices. A shift_out conductor 18 is coupled to one of I/O pads 16 (shown as reference number 16A). I/O pad 16A is similarly coupled to an I/O pad 16B, etc, until I/O pads 16 are serially connected in a chain ending with I/O pad 16C. Logic within core section 14 shifts high impedance states associated with each I/O pad 16 onto shift_out conductor 18 during consecutive clock cycles of the programming sequence for I/O pads 16. A shift clock signal is routed to I/O pad 16A upon a shift clock conductor 17, and an update clock signal is similarly routed upon an update clock conductor 19. Other I/O pads 16 are configured similar to I/O pad 16A. For simplicity, conductors 17 and 19 have not been shown coupled to each I/O pad 16. Shifting is preformed at the rising edge of the shift clock. During the programming sequence for I/O pads 16 (described below) the high impedance state associated with I/O pad 16C is shifted onto shift_out conductor 18 first, followed by respective high impedance states associated with each I/O pad 16 in the reverse order of their connection into the series chain of I/O pads 16. The high impedance states are shifted through I/O pad 16A, I/O pad 16B, etc. until each respective high impedance state reaches its associated I/O pad. It is noted that the shifting occurs such that each I/O pad 16 receives its respective high impedance state during the same clock cycle. It is further noted that a shift, as used herein, entails copying a value from a first storage location to a second storage location to which the first storage location is serially connected. Concurrently, the first storage location receives a value copied from yet another storage location to which the first storage location is serially connected.

Figure 2:
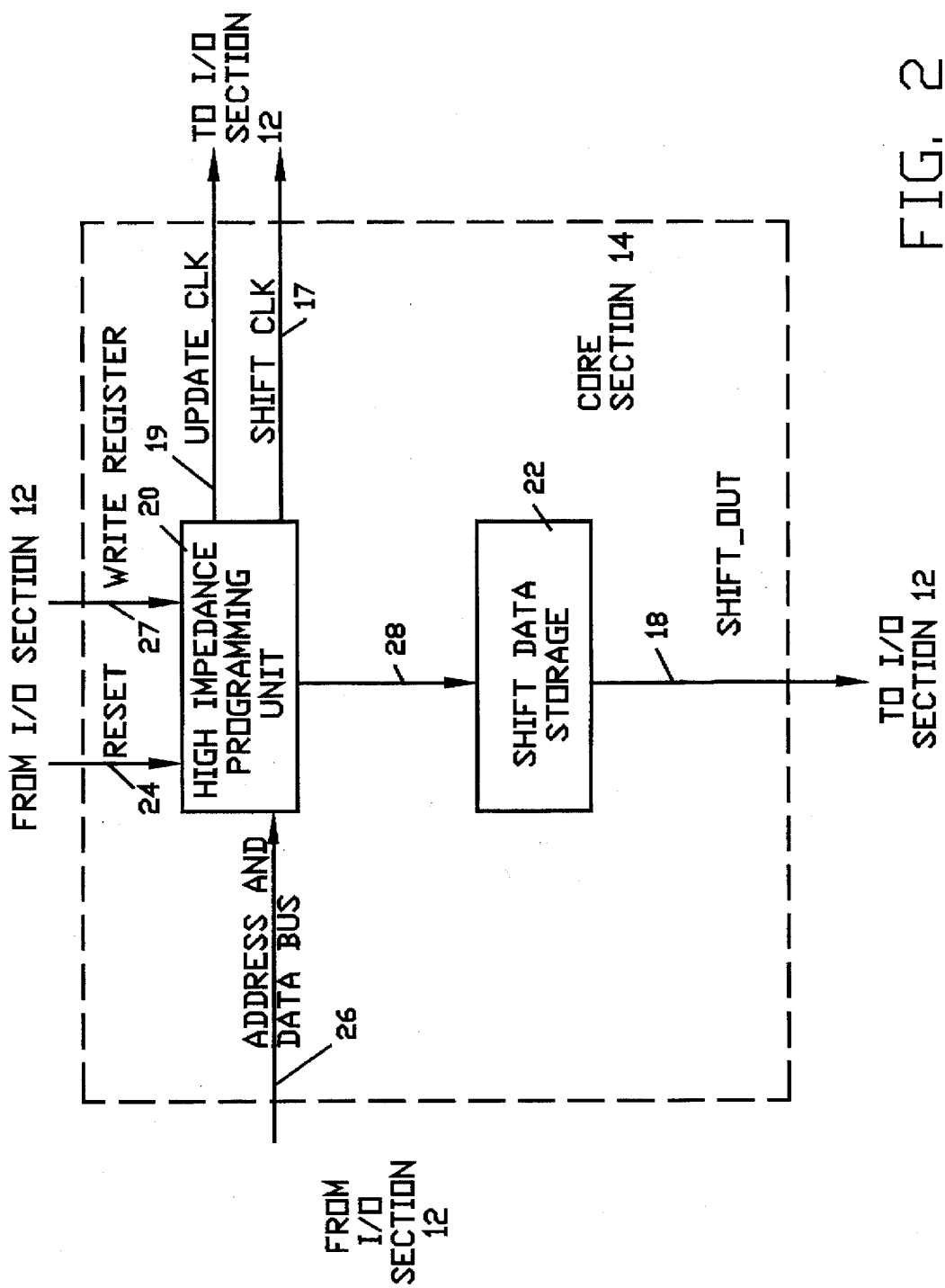
FIG. 2 is a block diagram of a portion of the core section shown in FIG. 1 having a shift data storage and a high impedance programming unit contained therein.

Turning now to FIG. 2, a portion of one embodiment of core section 14 is shown as a block diagram. A high impedance programming unit 20 is included, as well as a shift data storage 22. Coupled to high impedance programming unit 20 is a reset conductor 24, an address and data bus 26, and a write register conductor 27. High impedance programming unit 20 is coupled to shift data storage 22 via a control bus 28, and shift data storage 22 is further coupled to shift_out conductor 18. Additionally, high impedance control unit 20 produces a shift clock signal upon shift clock conductor 17 and an update clock signal upon update clock conductor 19.

High impedance programming unit 20 employs logic circuits configured to perform a programming sequence for I/O pads 16. The programming sequence includes receiving the high impedance states for each I/O pad 16 into shift data storage 22, shifting the high impedance states from shift data storage 22 through the serial chain of I/O pads 16 to the appropriate I/O pad, and storing the high impedance state into pullup and pulldown devices within the appropriate I/O pad 16.

During the programming sequence for I/O pads 16, address and data bus 26 conveys the high impedance states for I/O pads 16. During typical operation, address and data bus 26 conveys addresses and associated data between integrated circuit 10 and other electronic devices coupled thereto. High impedance programming unit 20 is configured to receive the high impedance states from the data portion of address and data bus 26 and to store the states into shift data storage 22. A signal activated upon write register conductor 27 causes data to be received and stored. In one embodiment, high impedance states are conveyed to integrated circuit 10 in any order. The address portion of address and data bus 26 identifies the storage location within shift data storage 22 which receives the data conveyed upon the data portion of address and data bus 26. In other words, address and data bus 26 includes separate conductors for conveying address as opposed to data information. Subsequent to the conveyance of high impedance states, the value of a status register within shift data storage 22 is conveyed. The status register includes an update-in-progress bit which disables access to shift data storage 22. It is noted that only those high impedance states which are to be changed from the values stored in shift data storage 22 need be programmed from address and data bus 26.

Once the update-in-progress bit is set, high impedance programming unit 20 causes shift data storage 22 to shift the high impedance states onto shift_out conductor 18. In one embodiment, one bit of high impedance state is shifted per clock cycle.

High impedance programming unit 20 receives a reset signal upon a reset conductor 24. The reset signal is activated by the system to request that integrated circuit 10 transition to a known initial state. Often, integrated circuit 10 transitions to the known state and remains in the known state until the reset signal is deactivated.

It is noted that shift data storage 22 may be accessed by software programs executing upon the system into which integrated circuit 10 is configured. A software program is a plurality of instructions to be executed upon a microprocessor to perform a particular action. It is noted that the programming sequence for I/O pads 16 may be performed under the control of software, or alternatively under control of an external hardware module, depending upon the embodiment.

Figure 3:
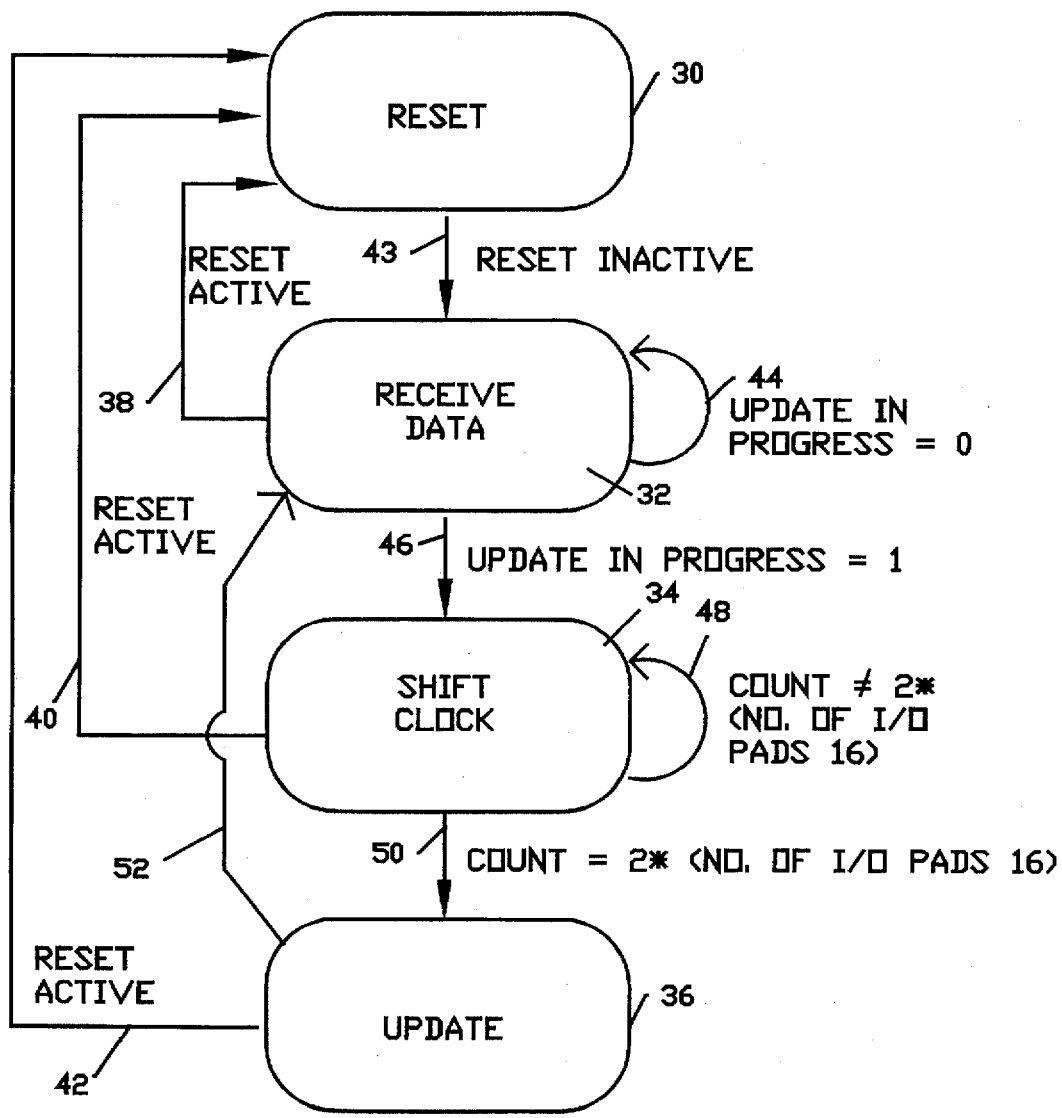
FIG. 3 is a flow diagram showing the states of a state machine for the high impedance programming unit.

Turning now to FIG. 3, an exemplary state machine diagram representing one embodiment of a state machine employed within high impedance programming unit 20 is shown. A state machine is a description of the actions that a particular unit will perform according to a set of input stimuli. Typically, a state machine describes a set of states carried forth within sequential logic. During each state, the unit performs a set of predefined actions associated with that state. One action that may be performed is a transition to another state. State machine diagrams show a transition between states as a transition arc originating on the current state and terminating on the next state. The conditions which cause the state change are typically noted on FIG. 3 near the transition arc.

The state machine shown in FIG. 3 includes a reset state 30, a receive data state 32, a shift clock state 34, and an update state 36. Each of the states returns to reset state 30 if a reset signal upon reset conductor 24 is activated. Transition arcs 38, 40, and 42 indicate the transition from states 32, 34, and 36, respectively.

When the reset signal is deactivated, the state machine transitions from reset state 30 to receive data state 32 (transition arc 43). During receive data state 32, data is collected from address and data bus 26 and stored into shift data storage 22 under the control of the write signal upon write conductor 27. High impedance programming unit 20 remains in receive data state 32 until the update-in-progress bit within the status register within shift data storage 22 is set. Shift data storage 22 comprises a number of storage locations sufficient to store high impedance states associated with each of I/O pads 16.

Once the update-in-progress bit is set, the state machine transitions to shift clock state 34. During shift clock state 34, a counter within the state machine is incremented during each clock cycle, and the state machine remains in shift clock state 34 until the counter reaches a maximum count value equal to twice the number of I/O pads 16 (transition arc 48). This maximum count value is arrived at by multiplying the number of bits comprising the high impedance state by the number of I/O pads 16. In one embodiment, one bit is shifted each clock cycle onto shift_out conductor 18 and the high impedance state includes two bits. Therefore, a number of clock cycles equal to twice the number of I/O pads 16 are used to shift the high impedance states to I/O pads 16. While the state machine is in shift clock state 34, the shift clock upon shift clock conductor 17 is toggled with a shift clock signal. While not constrained to the frequency of the clock signal received by integrated circuit 10, the shift clock cycle may have a similar frequency to that clock signal.

Once the counter reaches twice the number of I/O pads 16, the state machine transitions to update state 36 (transition arc 50). An update signal upon update clock conductor 19 is asserted, and the programming sequence is complete. The state machine transitions to the receive data state, ready for the next programming sequence. Additionally, the update-in-progress bit of the status register is reset.

Figure 4:
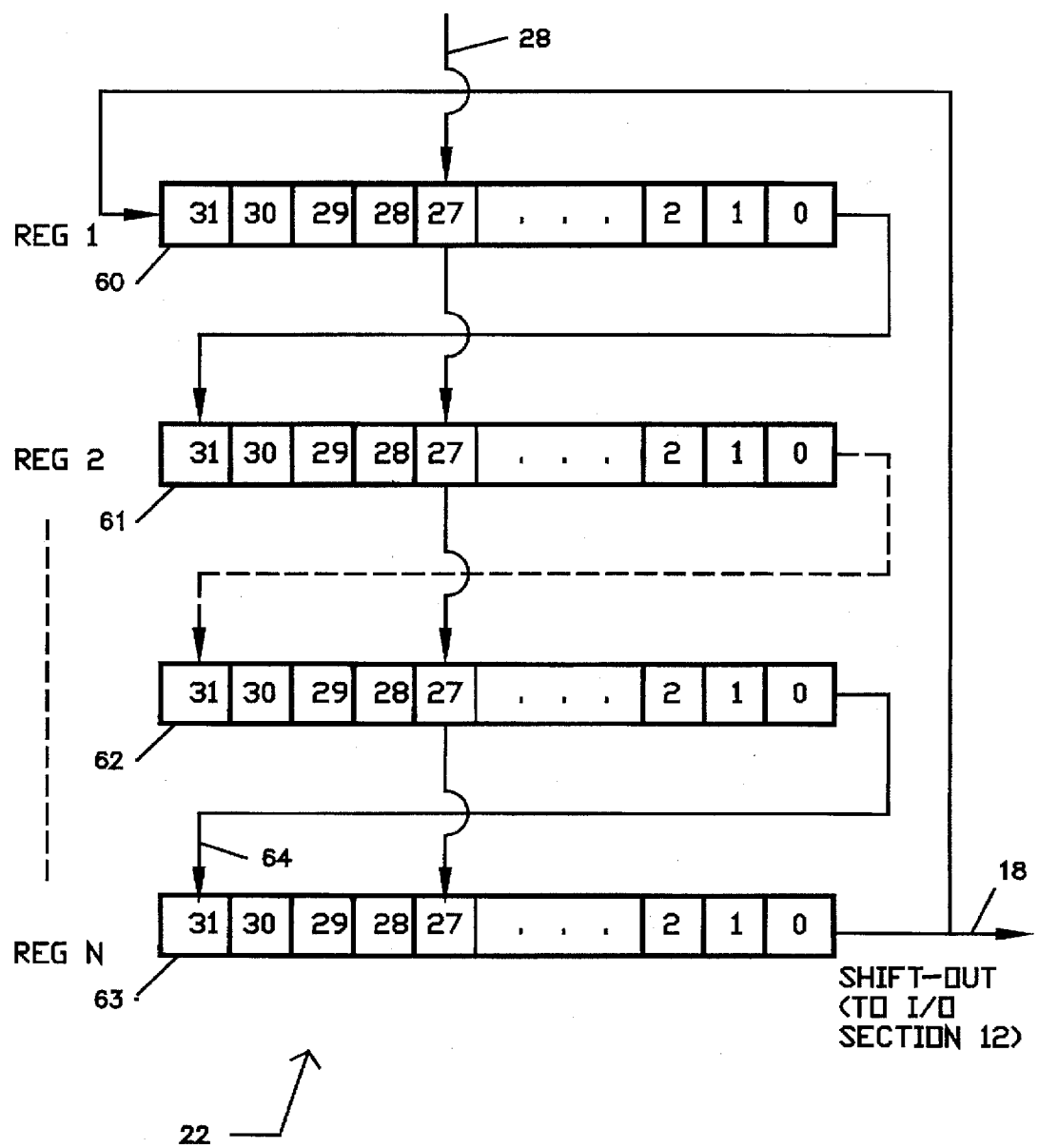
FIG. 4 is a diagram of the shift data storage according to one embodiment.

Turning now to FIG. 4, one embodiment of shift data storage 22 is shown. Shift data storage 22 includes a plurality of shift data registers, shown as Reg 1 (reference number 60) through Reg N (reference number 63). Each shift data register is 32 bits wide in this embodiment. The shift data registers store high impedance state according to the connection of I/O pads 16 into the serial chain shown in FIG. 1. Shift data register 60 stores high impedance states associated with I/O pads 16 near the beginning of the serial chain (such as I/O pads 16A and 16B). Registers 61 and 62 store high impedance states of I/O pads 16 which are coupled into intermediate positions of the serial chain. Shift data register 63 stores the high impedance states of I/O pads 16 near the end of the serial chain, such as I/O pad 16C. Each shift register 60–63 is identified by a unique address upon the address portion of address and data bus 26 for purposes of programming shift data storage 22.

The shift data registers are configured to shift the stored data one bit to the right as shown in FIG. 4 (i.e. one bit toward the least significant end of the register) according to the shift clock from high impedance programming unit 20. When the shift clock transitions from a logic zero value to a logic one value, then a shift occurs. In another embodiment, a shift occurs when the shift clock transitions from a logic one value to a logic zero value. Additionally, each shift data register is configured to receive a data bit for storing in the most significant bit position during a shift. The most significant bit position is bit position 31 in FIG. 4. The least significant bit (bit 0) of each shift data register is conveyed to the most significant bit of the next shift data register. The least significant bit of shift data register 63, in addition to being provided to shift data register 60, is conveyed upon shift_out conductor 18. In this manner, the shift data registers are coupled into a ring such that data is not lost when shifted through the shift registers.

As shown in FIG. 4, the number of I/O pads configured into integrated circuit 10 is an even multiple of 32. In cases where the number of I/O pads is not an even multiple of 32, conductor 64 is coupled to a different bit location of shift data register 63. The high impedance states stored into shift data register 63 are stored in lower order bit locations, and the higher order bit locations are unused.

Control bus 28 is shown coupled to each shift data register. Data is conveyed upon control bus 28 (along with control signals indicative of which shift data register should store the data) when high impedance programming unit 20 is in receive data state 32. When high impedance programming unit 20 is in shift clock state 34, a clock signal similar to the shift clock is conveyed upon control bus 28 such that the shift data registers shift according to the shift clock.

Figure 5:
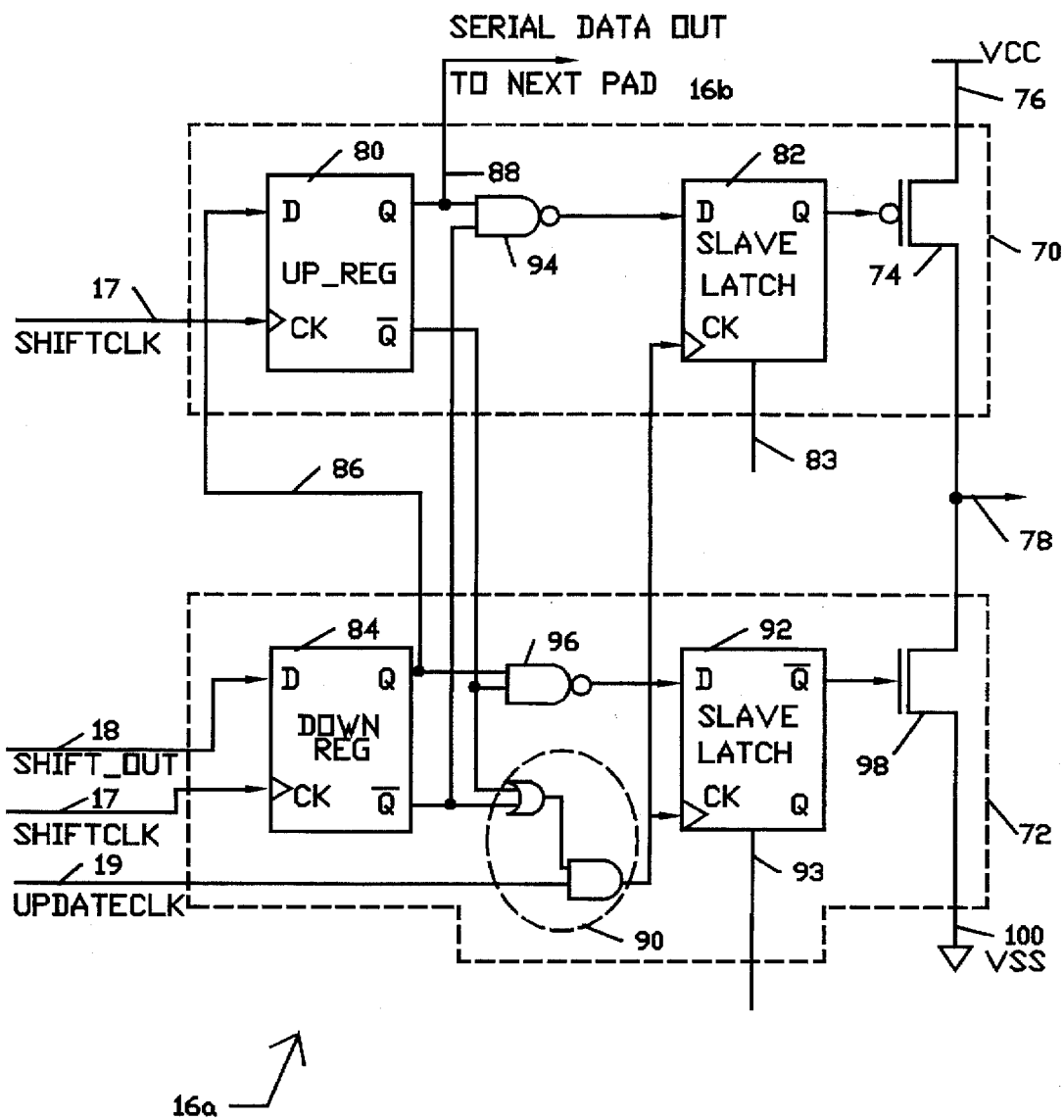
FIG. 5 is a circuit diagram of one of the plurality of input/output pads.

Turning now to FIG. 5, an exemplary circuit diagram of an I/O pad 16A and related circuitry is shown. Other I/O pads 16 are configured similarly. For simplicity, only portions of I/O pad 16A related to the present invention are shown. More details regarding circuitry employed in I/O pads may be found in the commonly assigned, co-pending patent application entitled: "A Programmable Input/Output Driver Circuit Capable of Operating at a Variety of Voltage Levels and Having a Programmable Pullup/Pulldown Function", Ser. No. 08/566,131, U.S. Pat. No. 5,583,454, filed concurrently herewith. The disclosure of the patent application is incorporated herein by reference in its entirety.

I/O pad 16A includes a pullup device 70 and a pulldown device 72. Pullup device 70 includes a pullup transistor 74 coupled between a power supply conductor 76 and an input/output conductor 78. Power supply conductor 76 is powered, during use, to a power supply voltage. The power supply voltage is represented upon FIG. 5 as Vcc, and may be a value corresponding to the voltage powering core section 14 of integrated circuit 10 or, conversely, a dissimilar voltage. Pullup transistor 74 is a PMOS transistor configured to charge I/O conductor 78 if the voltage applied to the gate terminal is at least a threshold voltage less than Vcc.

Pullup device 70 further includes a master register 80 and a slave latch 82. A "latch" is a storage device configured to store a new value if a clock signal input is enabled. If the input is not enabled, the previous value remains stored. The process of storing a value into a latch or register is referred to as "latching" a value. The latches and registers shown in FIG. 5 receive an input value at the "D" input and the clock signal at the "CK" input. The value at the "D" input is stored if the clock signal is enabled high. The output value is conveyed from the output labeled "Q", and a logically inverted output is conveyed from the output labeled "Q" with a bar over it. It is noted that master register 80 and other similar master registers comprise a master-slave flip-flop in one embodiment.

Master register 80 is configured to receive an input value from a master register 84 within pulldown device 72 upon a conductor 86. The clock signal controlling master register 80 is the shift clock generated by high impedance programming unit 20. Therefore, as the shift clock toggles upon shift clock conductor 17, master register 80 stores the value stored in master register 84. Similarly, master register 84 stores the value conveyed upon shift_out conductor 18. Additionally, the output of master register 80 conveys a value to I/O pad 16B upon a conductor 88. Therefore, master registers 80 and 84 (and similar registers within other I/O pads 16) perform the shifting function which transports each high impedance state to the appropriate I/O pad 16.

In one embodiment, the high impedance state associated with a particular I/O pad 16 comprises two bits. The encoding for the high impedance state is shown as table 1 below:

TABLE 1

High Impedance State Encoding

| Master register 84 | Master register 80 | Interpretation |
|---|---|---|
| 0 | 1 | pullup |
| 1 | 0 | pulldown |
| 0 | 0 | no pullup or pulldown |
| 1 | 1 | no change from previous state |

Slave latches 82 and 92 are configured to store the high impedance state of I/O pad 16A. Slave latch 82 receives its value when the update clock signal upon update clock conductor 19 is enabled if the new high impedance state is not encoded to be "no change from previous state". Combinatorial logic 90 detects the no change from previous state encoding within master latches 84 and 80, and prevents the update clock enable from reaching slave latches 82 and 92. The "no change from previous state" encoding is included to prevent interruption of the pullup/pulldown state upon I/O pads 16 if the state is not changed. Because transistors 74 and 98 are capable of low currents, the switching time of the I/O pads may be slow. Slow switching signals may cause unnecessary power consumption, and so if no change is selected then the previous state is left uninterrupted.

If the high impedance state for I/O pad 16A is the pullup function, then master register 80 contains a binary one and master register 84 contains a binary zero (see table 1). NAND gate 94, which provides the data input to slave latch 82, conveys a logical zero if the output of master register 80 is a binary one and the inverted output of master register 84 is a binary one (i.e. master register 84 stores a binary zero). Therefore, NAND gate 94 decodes the pullup encoding of the high impedance state. Slave latch 82 stores a binary zero for the pullup state. The output of slave latch 82 is coupled to the gate terminal of pullup transistor 74, thereby activating pullup transistor 74 when slave latch 82 stores a binary zero.

Similar to NAND gate 94, NAND gate 96 presents a binary zero to the data input of slave latch 92 if the high impedance state indicates a pulldown encoding. The inverted output of slave latch 92 is coupled to the gate terminal of a pulldown transistor 98. Pulldown transistor 98 is coupled between I/O conductor 78 and a ground conductor 100. The ground voltage level is represented as Vss upon FIG. 5. Pulldown transistor 98 is an NMOS transistor configured to discharge I/O conductor 78 when the voltage applied to its gate terminal is greater than the ground voltage by at least a threshold voltage value. Since slave latch 92 applies a binary one value to the gate terminal of pulldown transistor 98 when I/O pad 16A is programmed to a high impedance state of pulldown, slave latch 92 activates pulldown transistor 98 during the pulldown state.

It is noted that pullup transistor 74 and pulldown transistor 98 are capable of significantly less current flow than driver circuits coupled to I/O conductor 78. Therefore, pullup transistor 74 provides a "resistive one" and pulldown transistor 98 provides a "resistive zero" when the respective transistor is activated. A resistive one or resistive zero causes a logical one or zero, respectively, to be conveyed upon I/O conductor 78 if no driver circuit is active upon I/O conductor 78 during a clock cycle. If a driver circuit is active, the value conveyed by the driver circuit will be the value upon I/O conductor 78 for that clock cycle.

In one embodiment, slave latches 82 and 92 are configured with set/reset input terminals 83 and 93. Set/reset input terminals 83 and 93 allow slave latches 82 and 92 to be placed into a known state when integrated circuit 10 is first powered on. The choice of a set terminal or reset terminal for a particular I/O pad 16 is dictated by the nature of the signal conveyed upon that pad. A signal that is pulled up during high impedance is set to the pullup high impedance state. Conversely, a signal that is pulled down during high impedance is set to the pulldown high impedance state. In still another example, a signal that has no pullup or pulldown during high impedance is set to the no pullup/pulldown high impedance state. Slave latches with appropriate set or reset terminals are selected such that the high impedance state is formed upon power up. The set/reset terminals may be enabled by the reset signal coupled to integrated circuit 10.

Figure 6:
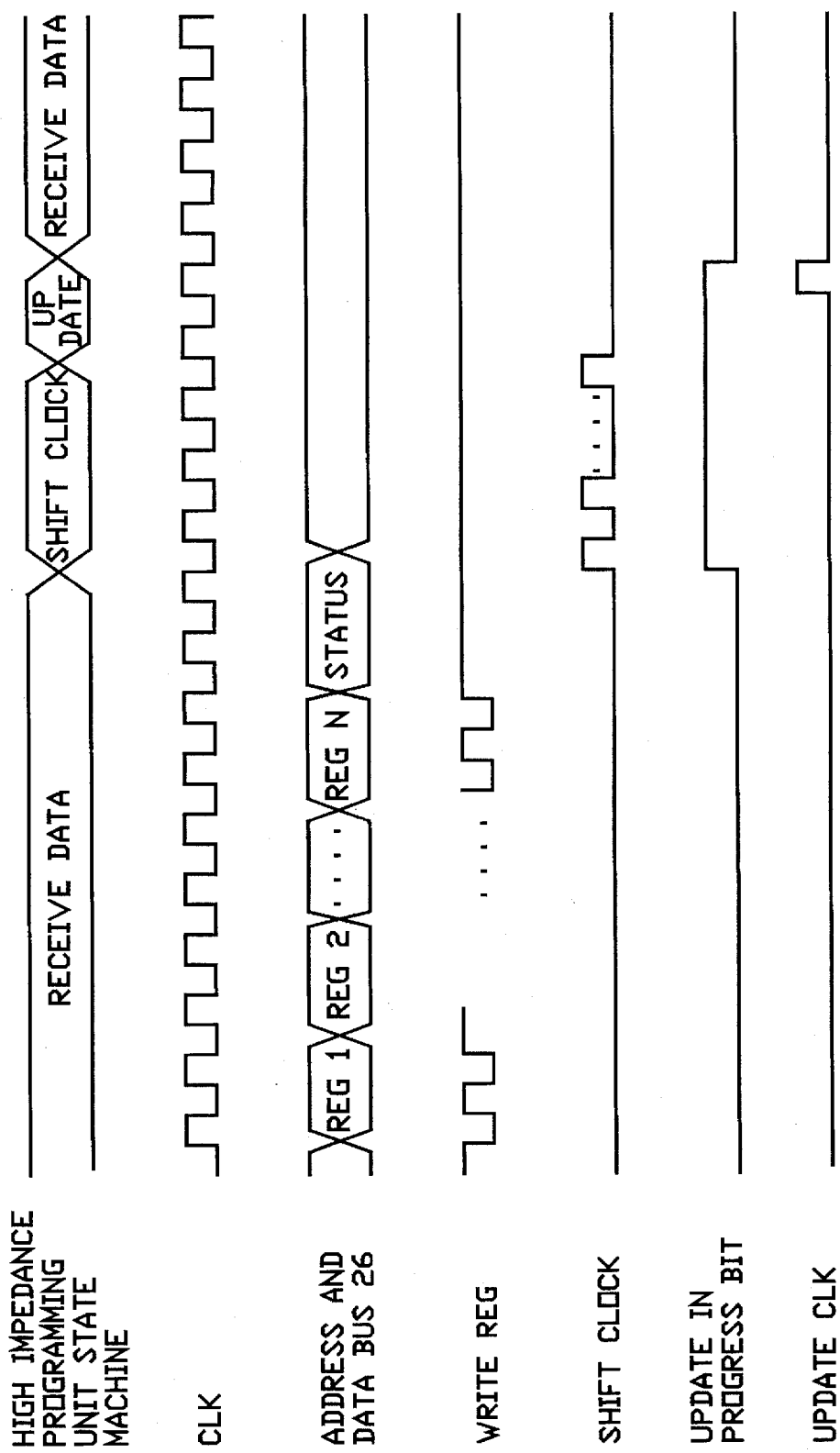
FIG. 6 is a timing diagram showing the programming of high impedance states into the plurality of input/output pads.

Turning now to FIG. 6, a timing diagram depicting the programming of I/O pads 16 with respective high impedance states is shown according to one embodiment. The states of the state machine within high impedance programming unit 20 are shown. Additionally, a clock waveform CLK is shown. Values upon address and data bus 26 are shown, followed by the shift clock and update clock waveforms and the update in progress bit from the status register.

FIG. 6 begins with the high impedance programming unit state machine in the receive data state. Address and data bus 26 transfers shift data register values according to the activation of the write register signal. When the shift data register values and the status register value have been transferred, the high impedance programming unit state machine transitions to the shift clock state due to the update-in-progress bit being set.

When the high impedance programming unit state machine transitions into the shift clock state, the shift clock waveform begins pulsing. Although the shift clock waveform is shown pulsing at the same frequency as the clock signal in FIG. 6, the shift clock need not pulse at this frequency. Other frequencies may be used. Each time the shift clock pulses, master registers within I/O pads 16 store the value presented at their inputs. Additionally, shift data storage 22 shifts a new value onto shift_out conductor 18.

Subsequent to a number of shift clock pulses equal to twice the number of I/O pads 16, the state machine transitions to the update state. The update clock is pulsed once, and the update-in-progress bit is reset. Data is transferred from the master registers with I/O pads 16 into the slave latches, and the programming of I/O pads 16 is complete. The high impedance programming unit state machine transitions into the received data state.

It is noted that the update-in-progress bit disabled access to shift data storage 22 because the storage is in a state of flux. Once the update-in-progress bit is reset, shift data storage 22 has been returned to its original state and may be accessed again.

In accordance with the above disclosure, an integrated circuit having programmable pullup and pulldown devices has been shown. Advantageously, pullup and pulldown functions are performed within the integrated circuit, reducing device count in a system employing the integrated circuit. Additionally, floating buses are driven to a defined high or low value. Power consumption is decreased due to the defined level. Furthermore, the pullup or pulldown for a particular conductor may be changed according to the needs of the system.

Numerous variations and modifications will become apparent to those skilled in the art once the above disclosure is fully appreciated. It is intended that the following claims be interpreted to embrace all such variations and modifications.

What is claimed is:

1. An integrated circuit, comprising:
   a high impedance programming unit configured to operatively program a plurality of high impedance states;
   a shift data storage coupled to said high impedance programming unit for storing said plurality of high impedance states, said shift data storage configured within a core section of said integrated circuit;
   a storage device coupled to receive and store a signal representative of one of said plurality of high impedance states; and
   a transistor having a source-drain path connected between one of a plurality of input/output pads and a power supply conductor, said transistor having a gate terminal operably connected for receiving said signal from said storage device and for conveying a respective voltage level upon said one of said plurality of input/output pads during a clock cycle in which an input/output signal upon said one of said plurality of input/output pads is idle.

2. The integrated circuit as recited in claim 1 wherein said shift data storage comprises a plurality of shift data registers serially coupled to one another.

3. An integrated circuit, comprising:
   a high impedance programming unit configured to operatively program a plurality of high impedance states;
   a shift data storage coupled to said high impedance programming unit for storing said plurality of high impedance states; and
   a transistor having a source-drain path connected between one of a plurality of input/output pads and a power supply conductor, said transistor having a gate terminal operably connected for receiving a signal representative of one of said plurality of high impedance states and for conveying a respective voltage level upon said one of said plurality of input/output pads, and wherein said plurality of input/output pads are serially coupled for receiving signals representative of said plurality of high impedance states.

4. The integrated circuit as recited in claim 3 wherein said high impedance programming unit, programs a transistor included within each one of said plurality of input/output pads by shifting said signals representative of each one of said high impedance states to said transistor included within said each one of said plurality of input/output pads through said serial coupling.

5. The integrated circuit as recited in claim 1 further comprising a conductor coupled between one of said plurality of input/output pads and said high impedance programming unit.

6. The integrated circuit as recited in claim 5 wherein said high impedance programming unit is configured to store said high impedance states into said shift data storage upon activation of a signal upon said conductor.

7. The integrated circuit as recited in claim 1 further comprising a bus coupled between a plurality of said plurality of input/output pads and said high impedance programming unit.

8. The integrated circuit as recited in claim 7 wherein said high impedance programming unit is configured to receive a plurality of signals representative of a plurality of said plurality of high impedance states upon said bus.

9. The integrated circuit as recited in claim 8 wherein said bus is configured to transfer address and data information during clock cycles in which said plurality of signals are not being received by said high impedance programming unit.

10. The integrated circuit as recited in claim 1 wherein each of said plurality of input/output pads comprises:
    an input/output conductor coupled to said one of said plurality of input/output pads;
    a pullup device programmable to maintain a pullup state upon said input/output conductor, wherein said pullup device is coupled between said power supply conductor and said input/output conductor, and wherein said pullup device includes said transistor; and
    a pulldown device programmable to maintain a pulldown state upon said input/output conductor, wherein said pulldown device is coupled between a ground conductor and said input/output conductor.

11. The integrated circuit as recited in claim 10 wherein said transistor comprises a PMOS transistor including said gate terminal.

12. The integrated circuit as recited in claim 11 wherein said pullup device further comprises a master register and a slave latch, and wherein said master register is coupled in series with master registers of other ones of said plurality of input/output pads, and wherein said slave latch is coupled to receive a pullup signal representative of a pullup state according to a value stored in said master register and to convey said value as a voltage level upon said gate terminal of said PMOS transistor.

13. The integrated circuit as recited in claim 12 wherein said slave latch receives said pullup signal subsequent to said programming unit programming said master register in accordance with a corresponding one of said plurality of high impedance states.

14. The integrated circuit as recited in claim 12 wherein said slave latch comprises a conductor configured to place said slave latch into a particular initial state when said integrated circuit is powered on.

15. The integrated circuit as recited in claim 10 wherein said pulldown device comprises an NMOS transistor coupled between said ground conductor and said input/output conductor, wherein said NMOS transistor includes a gate terminal.

16. The integrated circuit as recited in claim 15 wherein said pulldown device further comprises a master register and a slave latch, and wherein said master register is coupled in series with master registers of other input/output pads, and wherein said slave latch is coupled to receive a pulldown signal representative of a pulldown state according to a value stored in said master register and to convey said value upon said gate terminal of said NMOS transistor.

17. The integrated circuit as recited in claim 16 wherein said slave latch receives said pulldown signal subsequent to said programming unit programming said master register in accordance with a corresponding one of said plurality of high impedance states.

18. The integrated circuit as recited in claim 16 wherein said slave latch comprises a conductor configured to place said slave latch into a particular initial state when said integrated circuit is powered on.

19. A method of programming a plurality of pullup and pulldown devices associated with a plurality of input/output pads, comprising:

storing received data indicative of a high impedance state for each of said plurality of input/output pads;

shifting said received data to said input/output pads wherein a respective one of said plurality of input/output pads receives respective ones of said received data representative of a respective one of said high impedance states; and latching said respective ones of said received data into said plurality of pullup and pulldown devices such that said pullup and pulldown devices are enabled according to said respective ones of said high impedance states.

20. The method as recited in claim 19 further comprising receiving a reset indication prior to said storing.

21. The method as recited in claim 19 wherein said received data is delivered to said integrated circuit upon a bus.

22. The method as recited in claim 19 wherein said high impedance state comprises a two bit value.

23. The method as recited in claim 22 wherein a first bit of said two bit value being set and a second bit of said two bit value being clear is indicative of a pullup high impedance state.

24. The method as recited in claim 22 wherein a first bit of said two bit value being clear and a second bit of said two bit value being set is indicative of a pulldown high impedance state.

25. The method as recited in claim 19 wherein said storing is performed into a plurality of shift data registers.

26. The method as recited in claim 19 wherein said plurality of input/output pads are serially coupled.

27. The method as recited in claim 26 wherein a respective one of said plurality of input/output pads receives said respective ones of said received data subsequent to said respective ones of said received data being shifted through at least a portion of said serially coupled plurality of input/output pads.

28. An apparatus for programming high impedance states, comprising:

a plurality of registers for storing a plurality of control bits;

a master register/slave latch coupled to store one of said plurality of control bits during a shift clock transition; and a transistor having a gate terminal and a source-drain path, said gate terminal is coupled to receive an output of said master register/slave latch, and said source-drain path is coupled between an input/output pad and a power supply.

29. The apparatus as recited in claim 28, wherein said control bits represent high impedance states.

30. The apparatus as recited in claim 28, wherein said power supply is a positive voltage value.

31. The apparatus as recited in claim 28, wherein said power supply is ground voltage.

32. The apparatus as recited in claim 28, further comprising combinatorial logic interposed between a master portion and a slave portion of said master register/slave latch for calculating a first value to be stored in said slave portion responsive to a second value stored in said master portion.

\* \* \* \* \*